(12) United States Patent
Partridge et al.

(10) Patent No.: US 7,656,678 B2
(45) Date of Patent: Feb. 2, 2010

(54) STACKED MODULE SYSTEMS

(75) Inventors: Julian Partridge, Austin, TX (US);
James Douglas Wehrly, Jr., Austin, TX (US); David L. Roper, Austin, TX (US);
Joseph Villani, Sugar Land, TX (US)

(73) Assignee: Entorian Technologies, LP, Austin, TX (US)

( * ) Notice: Subject to any disclaimer, the term of this patent is extended or adjusted under 35 U.S.C. 154(b) by 529 days.

(21) Appl. No.: 11/263,627

(22) Filed: Oct. 31, 2005

(65) Prior Publication Data

US 2006/0092614 A1    May 4, 2006

Related U.S. Application Data

(63) Continuation-in-part of application No. 10/958,584, filed on Oct. 5, 2004, which is a continuation of application No. 10/136,890, filed on May 2, 2002, now Pat. No. 6,940,729, application No. 11/263,627, which is a continuation-in-part of application No. 10/873,847, filed on Jun. 22, 2004, now Pat. No. 7,094,632, which is a continuation of application No. 10/631,886, filed on Jul. 11, 2003, now Pat. No. 7,026,708, which is a continuation-in-part of application No. 10/453,398, filed on Jun. 3, 2003, now Pat. No. 6,914,324, which is a continuation-in-part of application No. 10/005,581, filed on Oct. 26, 2001, now Pat. No. 6,576,992, said application No. 10/631,886 is a continuation-in-part of application No. 10/457,608, filed on Jun. 9, 2003, now abandoned, which is a continuation-in-part of application No. 10/005,581, filed on Oct. 26, 2001, now Pat. No. 6,576,992.

(51) Int. Cl.
*H05K 7/10* (2006.01)
*H05K 7/12* (2006.01)

(52) U.S. Cl. .......... 361/767; 361/772; 361/774; 361/790

(58) Field of Classification Search ............ 361/790, 361/792–795
See application file for complete search history.

(56) References Cited

U.S. PATENT DOCUMENTS 3,294,988 A    12/1966    Packard (Continued)

FOREIGN PATENT DOCUMENTS

DE            004215467 A1    11/1992

(Continued)

OTHER PUBLICATIONS

PCT/US06/42232, International Search Report and Written Opinion dated Aug. 14, 2007.

(Continued)

*Primary Examiner*—Tuan T Dinh
(74) *Attorney, Agent, or Firm*—Civins Denko Coburn & Lauff LLP

(57) ABSTRACT

The present invention stacks integrated circuit packages into circuit modules. In a preferred embodiment, solder paste and primary adhesive respectively are applied to selected locations on the flex circuitry. Supplemental adhesive is applied to additional locations on the flex circuitry, CSP, or other component. The flex circuitry and the CSP are brought into proximity with each other. During solder reflow operation, a force is applied and the CSP collapses toward the flex circuitry, displacing the primary adhesive and the supplemental adhesive. The supplemental adhesive establishes a bond providing additional support to the flex circuitry. In another embodiment, CSPs or other integrated circuit packages are bonded to each other or to other components with a combination of adhesives. A rapid bond adhesive maintains alignment of the bonded packages and/or components during assembly, and a structural bond adhesive provides additional strength and/or structural integrity to the bond.

6 Claims, 9 Drawing Sheets

U.S. PATENT DOCUMENTS

| | | |
|---|---|---|
| 3,372,310 A | 3/1968 | Kantor |
| 3,411,122 A | 11/1968 | Schiller et al. |
| 3,436,604 A | 4/1969 | Hyltin |
| 3,654,394 A | 4/1972 | Gordon |
| 3,704,455 A | 11/1972 | Scarbrough |
| 3,718,842 A | 2/1973 | Abbott, III et al. |
| 3,727,064 A | 4/1973 | Bottini |
| 3,746,934 A | 7/1973 | Stein |
| 3,766,439 A | 10/1973 | Isaacson |
| 3,772,776 A | 11/1973 | Weisenburger |
| 3,806,767 A | 4/1974 | Lehrfeld |
| 3,983,547 A | 9/1976 | Almasi |
| 4,079,511 A | 3/1978 | Grabbe |
| 4,103,318 A | 7/1978 | Schwede |
| 4,169,642 A | 10/1979 | Mouissie |
| 4,288,841 A | 9/1981 | Gogal |
| 4,342,069 A | 7/1982 | Link |
| 4,381,421 A | 4/1983 | Coats et al. |
| 4,398,235 A | 8/1983 | Lutz et al. |
| 4,406,508 A | 9/1983 | Sadigh-Behzadi |
| 4,420,794 A | 12/1983 | Anderson |
| 4,429,349 A | 1/1984 | Zachry |
| 4,513,368 A | 4/1985 | Houseman |
| 4,587,596 A | 5/1986 | Bunnell |
| 4,645,944 A | 2/1987 | Uya |
| 4,656,605 A | 4/1987 | Clayton |
| 4,672,421 A | 6/1987 | Lin |
| 4,682,207 A | 7/1987 | Akasaki et al. |
| 4,696,525 A | 9/1987 | Coller et al. |
| 4,709,300 A | 11/1987 | Landis |
| 4,712,129 A | 12/1987 | Orcutt |
| 4,722,691 A | 2/1988 | Gladd et al. |
| 4,724,611 A | 2/1988 | Hagihara |
| 4,727,513 A | 2/1988 | Clayton |
| 4,733,461 A | 3/1988 | Nakano |
| 4,758,875 A | 7/1988 | Fujisaki et al. |
| 4,763,188 A | 8/1988 | Johnson |
| 4,821,007 A | 4/1989 | Fields et al. |
| 4,823,234 A | 4/1989 | Konishi et al. |
| 4,833,568 A | 5/1989 | Berhold |
| 4,839,717 A | 6/1989 | Phy et al. |
| 4,850,892 A | 7/1989 | Clayton et al. |
| 4,855,810 A | 8/1989 | Gelb et al. |
| 4,862,249 A | 8/1989 | Carlson |
| 4,884,237 A | 11/1989 | Mueller et al. |
| 4,891,789 A | 1/1990 | Quattrini et al. |
| 4,903,169 A | 2/1990 | Kitagawa et al. |
| 4,911,643 A | 3/1990 | Perry et al. |
| 4,953,060 A | 8/1990 | Lauffer et al. |
| 4,956,694 A | 9/1990 | Eide |
| 4,972,580 A | 11/1990 | Nakamura |
| 4,982,265 A | 1/1991 | Watanabe et al. |
| 4,983,533 A | 1/1991 | Go |
| 4,985,703 A | 1/1991 | Kaneyama |
| 4,992,849 A | 2/1991 | Corbett et al. |
| 4,992,850 A | 2/1991 | Corbett et al. |
| 5,012,323 A | 4/1991 | Farnworth |
| 5,014,115 A | 5/1991 | Moser |
| 5,014,161 A | 5/1991 | Lee et al. |
| 5,016,138 A | 5/1991 | Woodman |
| 5,025,306 A | 6/1991 | Johnson et al. |
| 5,034,350 A | 7/1991 | Marchisi |
| 5,041,015 A | 8/1991 | Travis |
| 5,041,902 A | 8/1991 | McShane |
| 5,050,039 A | 9/1991 | Edfors |
| 5,053,853 A | 10/1991 | Haj-Ali-Ahmadi et al. |
| 5,057,903 A | 10/1991 | Olla |
| 5,064,782 A | 11/1991 | Nishiguchi |
| 5,065,277 A | 11/1991 | Davidson |
| 5,068,708 A | 11/1991 | Newman |
| 5,081,067 A | 1/1992 | Shimizu et al. |
| 5,099,393 A | 3/1992 | Bentlage et al. |
| 5,104,820 A | 4/1992 | Go et al. |
| 5,109,318 A | 4/1992 | Funari et al. |
| 5,117,282 A | 5/1992 | Salatino |
| 5,119,269 A | 6/1992 | Nakayama |
| 5,122,862 A | 6/1992 | Kajihara et al. |
| 5,138,430 A | 8/1992 | Gow, III et al. |
| 5,138,434 A | 8/1992 | Wood et al. |
| 5,140,405 A | 8/1992 | King et al. |
| 5,158,912 A | 10/1992 | Kellerman et al. |
| 5,159,434 A | 10/1992 | Kohno et al. |
| 5,159,535 A | 10/1992 | Desai et al. |
| 5,168,926 A | 12/1992 | Watson et al. |
| 5,173,840 A | 12/1992 | Kodai et al. |
| 5,191,404 A | 3/1993 | Wu et al. |
| 5,198,888 A | 3/1993 | Sugano et al. |
| 5,198,965 A | 3/1993 | Curtis et al. |
| 5,208,729 A | 5/1993 | Cipolla et al. |
| 5,214,307 A | 5/1993 | Davis |
| 5,219,377 A | 6/1993 | Poradish |
| 5,219,794 A | 6/1993 | Satoh et al. |
| 5,222,014 A | 6/1993 | Lin |
| 5,224,023 A | 6/1993 | Smith et al. |
| 5,229,641 A | 7/1993 | Katayama |
| 5,229,916 A | 7/1993 | Frankeny et al. |
| 5,229,917 A | 7/1993 | Harris et al. |
| 5,239,198 A | 8/1993 | Lin et al. |
| 5,240,588 A | 8/1993 | Uchida |
| 5,241,454 A | 8/1993 | Ameen et al. |
| 5,241,456 A | 8/1993 | Marcinkiewiez et al. |
| 5,243,133 A | 9/1993 | Engle et al. |
| 5,247,423 A | 9/1993 | Lin et al. |
| 5,252,855 A | 10/1993 | Ogawa et al. |
| 5,252,857 A | 10/1993 | Kane et al. |
| 5,259,770 A | 11/1993 | Bates et al. |
| 5,261,068 A | 11/1993 | Gaskins et al. |
| 5,262,927 A | 11/1993 | Chia et al. |
| 5,266,746 A | 11/1993 | Nishihara et al. |
| 5,268,815 A | 12/1993 | Cipolla et al. |
| 5,276,418 A | 1/1994 | Klosowiak et al. |
| 5,279,029 A | 1/1994 | Burns |
| 5,281,852 A | 1/1994 | Normington |
| 5,289,062 A | 2/1994 | Wyland |
| 5,289,346 A | 2/1994 | Carey et al. |
| 5,311,401 A | 5/1994 | Gates, Jr. et al. |
| 5,313,097 A | 5/1994 | Haj-Ali-Ahmadi et al. |
| 4,437,235 A | 8/1994 | Burns |
| 5,337,388 A | 8/1994 | Jacobowitz et al. |
| 5,343,075 A | 8/1994 | Nishino |
| 5,343,366 A | 8/1994 | Cipolla et al. |
| 5,345,205 A | 9/1994 | Kornrumpf |
| 5,347,159 A | 9/1994 | Khandros et al. |
| 5,347,428 A | 9/1994 | Carson et al. |
| 5,357,478 A | 10/1994 | Kikuda et al. |
| 5,361,228 A | 11/1994 | Adachi et al. |
| 5,362,656 A | 11/1994 | McMahon |
| 5,375,041 A | 12/1994 | McMahon |
| 5,377,077 A | 12/1994 | Burns |
| 5,384,690 A | 1/1995 | Davis et al. |
| 5,386,341 A | 1/1995 | Olson et al. |
| 5,394,010 A | 2/1995 | Tazawa et al. |
| 5,394,300 A | 2/1995 | Yoshimura |
| 5,394,303 A | 2/1995 | Yamaji |
| 5,396,573 A | 3/1995 | Ecker et al. |
| 5,397,916 A | 3/1995 | Normington |
| 5,400,003 A | 3/1995 | Kledzik |
| 5,402,006 A | 3/1995 | O'Donley |
| 5,420,751 A | 5/1995 | Burns |
| 5,428,190 A | 6/1995 | Stopperan |
| 5,432,630 A | 7/1995 | Lebby et al. |
| 5,438,224 A | 8/1995 | Papageorge et al. |
| 5,446,620 A | 8/1995 | Burns et al. |
| 5,448,511 A | 9/1995 | Paurus et al. |

| | | | | | | |
|---|---|---|---|---|---|---|
| 5,455,740 | A | 10/1995 | Burns | 5,925,934 A | 7/1999 | Lim |
| 5,475,920 | A | 12/1995 | Burns et al. | 5,926,369 A | 7/1999 | Ingraham et al. |
| 5,477,082 | A | 12/1995 | Buckley, III et al. | 5,933,712 A | 8/1999 | Bernhardt et al. |
| 5,479,318 | A | 12/1995 | Burns | 5,949,657 A | 9/1999 | Karabatsos |
| 5,484,959 | A | 1/1996 | Burns | 5,953,214 A | 9/1999 | Dranchak et al. |
| 5,491,612 | A | 2/1996 | Nicewarner, Jr. et al. | 5,953,215 A | 9/1999 | Karabatsos |
| 5,493,476 | A | 2/1996 | Burns | 5,956,234 A | 9/1999 | Mueller |
| 5,499,160 | A | 3/1996 | Burns | 5,959,839 A | 9/1999 | Gates |
| 5,502,333 | A | 3/1996 | Bertin et al. | 5,963,427 A | 10/1999 | Bollesen |
| 5,509,197 | A | 4/1996 | Stone | 5,973,395 A | 10/1999 | Suzuki et al. |
| 5,514,907 | A | 5/1996 | Moshayedi | 5,995,370 A | 11/1999 | Nakamori |
| 5,516,989 | A | 5/1996 | Uedo et al. | 6,002,167 A | 12/1999 | Hatano et al. |
| 5,523,619 | A | 6/1996 | McAllister et al. | 6,002,589 A | 12/1999 | Perino et al. |
| 5,523,695 | A | 6/1996 | Lin | 6,008,538 A | 12/1999 | Akram et al. |
| 5,541,812 | A | 7/1996 | Burns | 6,013,948 A | 1/2000 | Akram et al. |
| 5,543,664 | A | 8/1996 | Burns | 6,014,316 A | 1/2000 | Eide |
| 5,561,591 | A | 10/1996 | Burns | 6,021,048 A | 2/2000 | Smith |
| 5,566,051 | A | 10/1996 | Burns | 6,025,642 A | 2/2000 | Burns |
| 5,567,654 | A | 10/1996 | Beilstein et al. | 6,028,352 A | 2/2000 | Eide |
| 5,572,065 | A | 11/1996 | Burns | 6,028,365 A | 2/2000 | Akram et al. |
| 5,588,205 | A | 12/1996 | Roane | 6,034,878 A | 3/2000 | Osaka et al. |
| 5,592,364 | A | 1/1997 | Roane | 6,038,132 A | 3/2000 | Tokunaga et al. |
| 5,594,275 | A | 1/1997 | Kwon et al. | 6,040,624 A | 3/2000 | Chambers et al. |
| 5,600,178 | A | 2/1997 | Russell | 6,049,975 A | 4/2000 | Clayton |
| 5,610,833 | A | 3/1997 | Chang et al. | 6,060,339 A | 5/2000 | Akram et al. |
| 5,612,570 | A | 3/1997 | Eide et al. | 6,072,233 A | 6/2000 | Corisis et al. |
| 5,620,782 | A | 4/1997 | Davis et al. | 6,078,515 A | 6/2000 | Nielsen et al. |
| 5,631,191 | A | 5/1997 | Durand et al. | 6,084,293 A | 7/2000 | Ohuchi |
| 5,631,193 | A | 5/1997 | Burns | 6,084,294 A | 7/2000 | Tomita |
| 5,642,055 | A | 6/1997 | Difrancesco | 6,084,778 A | 7/2000 | Malhi |
| 5,644,161 | A | 7/1997 | Burns | 6,091,145 A | 7/2000 | Clayton |
| 5,644,839 | A | 7/1997 | Stone | 6,097,087 A | 8/2000 | Farnworth et al. |
| 5,646,446 | A | 7/1997 | Nicewarner, Jr. et al. | 6,102,710 A | 8/2000 | Beilin et al. |
| 5,654,877 | A | 8/1997 | Burns | 6,111,757 A | 8/2000 | Dell et al. |
| 5,657,537 | A | 8/1997 | Saia et al. | 6,111,761 A | 8/2000 | Peana et al. |
| 5,661,339 | A | 8/1997 | Clayton | 6,114,763 A | 9/2000 | Smith |
| 5,677,569 | A | 10/1997 | Choi et al. | 6,121,676 A | 9/2000 | Solberg |
| 5,686,730 | A | 11/1997 | Laudon et al. | RE36,916 E | 10/2000 | Moshayedi |
| 5,708,297 | A | 1/1998 | Clayton | 6,130,477 A | 10/2000 | Chen et al. |
| 5,714,802 | A | 2/1998 | Cloud et al. | 6,147,398 A | 11/2000 | Nakazato et al. |
| 5,717,556 | A | 2/1998 | Yanagida | 6,157,541 A | 12/2000 | Hacke |
| 5,729,894 | A | 3/1998 | Rostoker et al. | 6,165,817 A | 12/2000 | Akram |
| 5,731,633 | A | 3/1998 | Clayton | 6,166,443 A | 12/2000 | Inaba et al. |
| 5,744,827 | A | 4/1998 | Jeong et al. | 6,172,874 B1 | 1/2001 | Bartilson |
| 5,744,862 | A | 4/1998 | Ishii | 6,178,093 B1 | 1/2001 | Bhatt et al. |
| 5,749,997 | A | 5/1998 | Tang et al. | 6,180,881 B1 | 1/2001 | Isaak |
| 5,751,553 | A | 5/1998 | Clayton | 6,186,106 B1 | 2/2001 | Glovatsky |
| 5,754,409 | A | 5/1998 | Smith | 6,187,652 B1 | 2/2001 | Chou et al. |
| 5,763,296 | A | 6/1998 | Casati et al. | 6,205,654 B1 | 3/2001 | Burns |
| 5,764,497 | A | 6/1998 | Mizumo et al. | 6,208,521 B1 | 3/2001 | Nakatsuka |
| 5,776,797 | A | 7/1998 | Nicewarner, Jr. et al. | 6,208,546 B1 | 3/2001 | Ikeda |
| 5,778,522 | A | 7/1998 | Burns | 6,214,641 B1 | 4/2001 | Akram |
| 5,783,464 | A | 7/1998 | Burns | 6,215,181 B1 | 4/2001 | Akram et al. |
| 5,783,870 | A | 7/1998 | Mostafazadeh et al. | 6,215,687 B1 | 4/2001 | Sugano et al. |
| 5,789,815 | A | 8/1998 | Tessier et al. | 6,218,731 B1 | 4/2001 | Huang et al. |
| 5,790,380 | A | 8/1998 | Frankeny | 6,222,737 B1 | 4/2001 | Ross |
| 5,790,447 | A | 8/1998 | Laudon et al. | 6,222,739 B1 | 4/2001 | Bhakta et al. |
| 5,801,437 | A | 9/1998 | Burns | 6,225,688 B1 | 5/2001 | Kim et al. |
| 5,801,439 | A | 9/1998 | Fujisawa et al. | 6,232,659 B1 | 5/2001 | Clayton |
| 5,802,395 | A | 9/1998 | Connolly et al. | 6,233,650 B1 | 5/2001 | Johnson et al. |
| 5,804,870 | A | 9/1998 | Burns | 6,234,820 B1 | 5/2001 | Perino et al. |
| 5,805,422 | A | 9/1998 | Otake et al. | 6,236,565 B1 | 5/2001 | Gordon |
| 5,828,125 | A | 10/1998 | Burns | 6,262,476 B1 | 7/2001 | Vidal |
| 5,835,988 | A | 11/1998 | Ishii | 6,262,895 B1 | 7/2001 | Forthun |
| 5,841,721 | A | 11/1998 | Kwon et al. | 6,265,660 B1 | 7/2001 | Tandy |
| 5,852,326 | A | 12/1998 | Khandros et al. | 6,265,766 B1 | 7/2001 | Moden |
| 5,869,353 | A | 2/1999 | Levy et al. | 6,266,252 B1 | 7/2001 | Karabatsos |
| 5,872,051 | A | 2/1999 | Fallon et al. | 6,271,058 B1 | 8/2001 | Yoshida |
| 5,895,969 | A | 4/1999 | Masuda et al. | 6,272,741 B1 | 8/2001 | Kennedy et al. |
| 5,895,970 | A | 4/1999 | Miyoshi et al. | 6,281,577 B1 | 8/2001 | Oppermann et al. |
| 5,899,705 | A | 5/1999 | Akram | 6,285,560 B1 | 9/2001 | Lyne |
| 5,917,709 | A | 6/1999 | Johnson et al. | 6,288,907 B1 | 9/2001 | Burns |
| 5,922,061 | A | 7/1999 | Robinson | 6,288,924 B1 | 9/2001 | Sugano et al. |

| | | |
|---|---|---|
| 6,300,679 B1 | 10/2001 | Mukerji et al. |
| 6,303,981 B1 | 10/2001 | Moden |
| 6,310,392 B1 | 10/2001 | Burns |
| 6,313,998 B1 | 11/2001 | Kledzik |
| 6,316,825 B1 | 11/2001 | Park et al. |
| 6,320,137 B1 | 11/2001 | Bonser et al. |
| 6,323,060 B1 | 11/2001 | Isaak |
| 6,329,708 B1 | 12/2001 | Komiyama |
| 6,336,262 B1 | 1/2002 | Dalal et al. |
| 6,343,020 B1 | 1/2002 | Lin et al. |
| 6,347,394 B1 | 2/2002 | Ochoa et al. |
| 6,349,050 B1 | 2/2002 | Woo et al. |
| 6,351,029 B1 | 2/2002 | Isaak |
| 6,358,772 B2 | 3/2002 | Miyoshi |
| 6,360,433 B1 | 3/2002 | Ross |
| 6,360,935 B1 | 3/2002 | Flake |
| 6,368,896 B2 | 4/2002 | Farnworth et al. |
| 6,370,668 B1 | 4/2002 | Garrett, Jr. et al. |
| 6,376,769 B1 | 4/2002 | Chung |
| 6,384,339 B1 | 5/2002 | Neuman |
| 6,392,162 B1 | 5/2002 | Karabatsos |
| 6,395,391 B1 | 5/2002 | Oka et al. |
| 6,404,043 B1 | 6/2002 | Isaak |
| 6,410,857 B1 | 6/2002 | Gonya |
| 6,414,384 B1 | 7/2002 | Lo et al. |
| 6,416,386 B2 | 7/2002 | Hembree |
| 6,423,622 B1 | 7/2002 | Chen et al. |
| 6,426,240 B2 | 7/2002 | Isaak |
| 6,426,549 B1 | 7/2002 | Isaak |
| 6,426,560 B1 | 7/2002 | Kawamura et al. |
| 6,428,360 B2 | 8/2002 | Hassanzadeh et al. |
| 6,433,418 B1 | 8/2002 | Fujisawa et al. |
| 6,437,990 B1 | 8/2002 | Degani et al. |
| 6,441,476 B1 | 8/2002 | Emoto |
| 6,444,490 B2 | 9/2002 | Bertin et al. |
| 6,444,921 B1 | 9/2002 | Wang et al. |
| 6,446,158 B1 | 9/2002 | Karabatsos |
| 6,447,321 B1 | 9/2002 | Perino et al. |
| 6,449,159 B1 | 9/2002 | Haba |
| 6,452,826 B1 | 9/2002 | Kim et al. |
| 6,462,408 B1 | 10/2002 | Wehrly, Jr. |
| 6,462,412 B2 | 10/2002 | Kamei et al. |
| 6,462,423 B1 | 10/2002 | Akram et al. |
| 6,465,877 B1 | 10/2002 | Farnworth et al. |
| 6,465,893 B1 | 10/2002 | Khandros et al. |
| 6,469,377 B1 | 10/2002 | Kondo |
| 6,472,735 B2 | 10/2002 | Isaak |
| 6,473,308 B2 | 10/2002 | Forthun |
| 6,486,544 B1 | 11/2002 | Hashimoto |
| 6,487,078 B2 | 11/2002 | Kledzik et al. |
| 6,489,178 B2 | 12/2002 | Coyle et al. |
| 6,489,687 B1 | 12/2002 | Hashimoto |
| 6,492,718 B2 | 12/2002 | Ohmori |
| 6,500,697 B2 | 12/2002 | Ahmad |
| 6,502,161 B1 | 12/2002 | Perego et al. |
| 6,504,104 B2 | 1/2003 | Hacke et al. |
| 6,509,639 B1 | 1/2003 | Lin |
| 6,514,793 B2 | 2/2003 | Isaak |
| 6,521,530 B2 | 2/2003 | Peters et al. |
| 6,522,018 B1 | 2/2003 | Tay et al. |
| 6,528,870 B2 | 3/2003 | Fukatsu et al. |
| 6,531,772 B2 | 3/2003 | Akram et al. |
| 6,532,162 B2 | 3/2003 | Schoenborn |
| 6,538,895 B2 | 3/2003 | Worz et al. |
| 6,544,815 B2 | 4/2003 | Isaak |
| 6,549,413 B2 | 4/2003 | Karnezos et al. |
| 6,552,910 B1 | 4/2003 | Moon et al. |
| 6,552,948 B2 | 4/2003 | Woo et al. |
| 6,559,521 B2 | 5/2003 | Tuttle |
| 6,560,117 B2 | 5/2003 | Moon |
| 6,566,746 B2 | 5/2003 | Isaak et al. |
| 6,572,387 B2 | 6/2003 | Burns et al. |
| 6,573,593 B1 | 6/2003 | Syri et al. |
| 6,576,992 B1 | 6/2003 | Cady et al. |
| 6,588,095 B2 | 7/2003 | Pan |
| 6,590,282 B1 | 7/2003 | Wang et al. |
| 6,600,222 B1 | 7/2003 | Levardo |
| 6,608,763 B1 | 8/2003 | Burns et al. |
| 6,614,664 B2 | 9/2003 | Lee |
| 6,617,510 B2 | 9/2003 | Schreiber et al. |
| 6,620,651 B2 | 9/2003 | He et al. |
| 6,624,507 B1 | 9/2003 | Nguyen et al. |
| 6,627,984 B2 | 9/2003 | Bruce et al. |
| 6,629,855 B1 | 10/2003 | North et al. |
| 6,646,333 B1 | 11/2003 | Hogerl |
| 6,646,335 B2 | 11/2003 | Emoto |
| 6,646,936 B2 | 11/2003 | Hamamatsu et al. |
| 6,651,320 B1 * | 11/2003 | Yagi et al. .................... 29/840 |
| 6,657,134 B2 | 12/2003 | Spielberger et al. |
| 6,660,561 B2 | 12/2003 | Forthun |
| 6,661,092 B2 | 12/2003 | Shibata et al. |
| 6,670,700 B1 | 12/2003 | Hashimoto |
| 6,673,651 B2 | 1/2004 | Ohuchi et al. |
| 6,677,670 B2 | 1/2004 | Kondo |
| 6,683,377 B1 | 1/2004 | Shim et al. |
| 6,689,634 B1 | 2/2004 | Lyne |
| 6,690,584 B2 | 2/2004 | Uzuka et al. |
| 6,699,730 B2 | 3/2004 | Kim et al. |
| 6,707,148 B1 | 3/2004 | Mostafazedeh et al. |
| 6,707,684 B1 | 3/2004 | Andric et al. |
| 6,709,893 B2 | 3/2004 | Moden et al. |
| 6,710,437 B2 | 3/2004 | Takahashi et al. |
| 6,720,652 B2 | 4/2004 | Akram et al. |
| 6,721,185 B2 | 4/2004 | Dong et al. |
| 6,721,226 B2 | 4/2004 | Woo et al. |
| 6,724,076 B1 | 4/2004 | Kahlisch et al. |
| 6,726,346 B2 | 4/2004 | Shoji |
| 6,737,891 B2 | 5/2004 | Karabatsos |
| 6,744,656 B2 | 6/2004 | Sugano et al. |
| 6,746,894 B2 | 6/2004 | Fee et al. |
| 6,751,113 B2 | 6/2004 | Bhakta et al. |
| 6,756,661 B2 | 6/2004 | Tsuneda et al. |
| 6,760,220 B2 | 7/2004 | Canter et al. |
| 6,762,495 B1 | 7/2004 | Reyes et al. |
| 6,762,769 B2 | 7/2004 | Moon et al. |
| 6,765,288 B2 | 7/2004 | Damberg |
| 6,768,660 B2 | 7/2004 | Kong et al. |
| 6,773,848 B1 | 8/2004 | Nortoft et al. |
| 6,776,797 B1 | 8/2004 | Blom |
| 6,778,404 B1 | 8/2004 | Bolken et al. |
| 6,781,240 B2 | 8/2004 | Choi et al. |
| 6,803,651 B1 | 10/2004 | Chiang |
| 6,812,567 B2 | 11/2004 | Kim et al. |
| 6,821,029 B1 | 11/2004 | Grung et al. |
| 6,833,981 B2 | 12/2004 | Suwabe et al. |
| 6,833,984 B1 | 12/2004 | Belgacem |
| 6,838,761 B2 | 1/2005 | Karnezos |
| 6,839,266 B1 | 1/2005 | Garrett, Jr. et al. |
| 6,841,855 B2 | 1/2005 | Jaeck et al. |
| 6,841,868 B2 | 1/2005 | Akram et al. |
| 6,849,949 B1 | 2/2005 | Lyu et al. |
| 6,850,414 B2 | 2/2005 | Benisek et al. |
| 6,858,910 B2 | 2/2005 | Coyle et al. |
| 6,867,496 B1 | 3/2005 | Hashimoto |
| 6,869,825 B2 | 3/2005 | Chiu |
| 6,873,039 B2 | 3/2005 | Beroz et al. |
| 6,873,534 B2 | 3/2005 | Bhakta et al. |
| 6,876,074 B2 | 4/2005 | Kim |
| 6,878,571 B2 | 4/2005 | Isaak et al. |
| 6,879,047 B1 | 4/2005 | Heo |
| 6,884,653 B2 | 4/2005 | Larson |
| 6,891,729 B2 | 5/2005 | Ko et al. |
| 6,893,897 B2 | 5/2005 | Sweterlitsch |
| 6,897,565 B2 | 5/2005 | Pflughaupt et al. |
| 6,908,792 B2 | 6/2005 | Bruce et al. |
| 6,910,268 B2 | 6/2005 | Miller |

| | | |
|---|---|---|
| 6,913,949 B2 | 7/2005 | Pflughaupt et al. |
| 6,914,324 B2 | 7/2005 | Rapport et al. |
| 6,919,626 B2 | 7/2005 | Burns |
| 6,927,471 B2 | 8/2005 | Salmon |
| 6,927,484 B2 | 8/2005 | Thomas et al. |
| 6,940,158 B2 | 9/2005 | Haba et al. |
| 6,940,729 B2 | 9/2005 | Cady et al. |
| 6,956,883 B2 | 10/2005 | Kamoto |
| 6,965,166 B2 | 11/2005 | Hikita et al. |
| 6,977,440 B2 | 12/2005 | Pflughaupt et al. |
| 6,978,538 B2 | 12/2005 | DiStefano et al. |
| 6,984,885 B1 | 1/2006 | Harada et al. |
| 6,998,704 B2 | 2/2006 | Yamazaki et al. |
| 7,023,701 B2 | 4/2006 | Stocken et al. |
| 7,053,485 B2 | 5/2006 | Bang et al. |
| 7,071,547 B2 | 7/2006 | Kang et al. |
| 7,081,373 B2 | 7/2006 | Roeters et al. |
| 7,104,804 B2 | 9/2006 | Batinovich |
| 7,115,986 B2 | 10/2006 | Moon et al. |
| 7,129,571 B2 | 10/2006 | Kang |
| 7,149,095 B2 | 12/2006 | Warner et al. |
| 7,180,167 B2 | 2/2007 | Partridge et al. |
| 7,235,871 B2 | 6/2007 | Corisis |
| 7,246,431 B2 | 7/2007 | Bang et al. |
| 7,291,906 B2 | 11/2007 | Cha et al. |
| 7,371,609 B2 | 5/2008 | Partridge et al. |
| 2001/0001085 A1 | 5/2001 | Hassanzadeh et al. |
| 2001/0006252 A1 | 7/2001 | Kim et al. |
| 2001/0013423 A1 | 8/2001 | Dalal et al. |
| 2001/0015487 A1 | 8/2001 | Forthun |
| 2001/0020740 A1 | 9/2001 | Moden et al. |
| 2001/0026009 A1 | 10/2001 | Tsuneda et al. |
| 2001/0028588 A1 | 10/2001 | Yamada et al. |
| 2001/0035572 A1 | 11/2001 | Isaak |
| 2001/0040793 A1 | 11/2001 | Inaba |
| 2001/0052637 A1 | 12/2001 | Akram et al. |
| 2002/0001216 A1 | 1/2002 | Sugano et al. |
| 2002/0006032 A1 | 1/2002 | Karabatsos |
| 2002/0030975 A1 | 3/2002 | Moon et al. |
| 2002/0030995 A1 | 3/2002 | Shoji |
| 2002/0044423 A1 | 4/2002 | Primavera et al. |
| 2002/0048849 A1 | 4/2002 | Isaak |
| 2002/0076919 A1 | 6/2002 | Peters et al. |
| 2002/0094603 A1 | 7/2002 | Isaak |
| 2002/0101261 A1 | 8/2002 | Karabatsos |
| 2002/0114143 A1 | 8/2002 | Morrison et al. |
| 2002/0126951 A1 | 9/2002 | Sutherland et al. |
| 2002/0139577 A1 | 10/2002 | Miller |
| 2002/0164838 A1 | 11/2002 | Moon et al. |
| 2002/0180022 A1 | 12/2002 | Emoto |
| 2002/0185731 A1 | 12/2002 | Akram et al. |
| 2002/0196612 A1 | 12/2002 | Gall et al. |
| 2003/0002262 A1 | 1/2003 | Benisek et al. |
| 2003/0016710 A1 | 1/2003 | Kamoto |
| 2003/0020153 A1 | 1/2003 | Bruce et al. |
| 2003/0026155 A1 | 2/2003 | Yamagata |
| 2003/0035328 A1 | 2/2003 | Hamamatsu et al. |
| 2003/0045025 A1 | 3/2003 | Coyle et al. |
| 2003/0049886 A1 | 3/2003 | Salmon |
| 2003/0064548 A1 | 4/2003 | Isaak |
| 2003/0081387 A1 | 5/2003 | Schulz |
| 2003/0081392 A1 | 5/2003 | Cady et al. |
| 2003/0089978 A1 | 5/2003 | Miyamoto et al. |
| 2003/0090879 A1 | 5/2003 | Doblar et al. |
| 2003/0096497 A1 | 5/2003 | Moore et al. |
| 2003/0107118 A1 | 6/2003 | Pflughaupt et al. |
| 2003/0109078 A1 | 6/2003 | Takahashi et al. |
| 2003/0113998 A1 | 6/2003 | Ross |
| 2003/0116835 A1 | 6/2003 | Miyamoto et al. |
| 2003/0146518 A1 | 8/2003 | Hikita et al. |
| 2003/0159278 A1 | 8/2003 | Peddle |
| 2003/0164551 A1 | 9/2003 | Lee et al. |
| 2003/0168725 A1 | 9/2003 | Warner et al. |
| 2004/0000708 A1 | 1/2004 | Rapport et al. |
| 2004/0004281 A1 | 1/2004 | Bai et al. |
| 2004/0012991 A1 | 1/2004 | Kozaru |
| 2004/0021211 A1 | 2/2004 | Damberg |
| 2004/0031972 A1 | 2/2004 | Pflughaupt et al. |
| 2004/0045159 A1 | 3/2004 | DiStefano et al. |
| 2004/0065963 A1 | 4/2004 | Karnezos |
| 2004/0075991 A1 | 4/2004 | Haba et al. |
| 2004/0099938 A1 | 5/2004 | Kang et al. |
| 2004/0104470 A1 | 6/2004 | Bang et al. |
| 2004/0115866 A1 | 6/2004 | Bang et al. |
| 2004/0150107 A1 | 8/2004 | Cha et al. |
| 2004/0157362 A1 | 8/2004 | Beroz et al. |
| 2004/0203190 A1 | 10/2004 | Pflughaupt et al. |
| 2004/0217461 A1 | 11/2004 | Damberg |
| 2004/0217471 A1 | 11/2004 | Haba |
| 2004/0238931 A1 | 12/2004 | Haba et al. |
| 2004/0245617 A1 | 12/2004 | Damberg et al. |
| 2004/0267409 A1 | 12/2004 | De Lorenzo et al. |
| 2005/0018495 A1 | 1/2005 | Bhakta et al. |
| 2005/0035440 A1 | 2/2005 | Mohammed |
| 2005/0040508 A1 | 2/2005 | Lee |
| 2005/0047250 A1 | 3/2005 | Ruckerbauer et al. |
| 2005/0108468 A1 | 5/2005 | Hazelnut et al. |
| 2005/0133897 A1 | 6/2005 | Baek et al. |
| 2005/0251586 A1 | 11/2005 | Lin |

FOREIGN PATENT DOCUMENTS

| | | |
|---|---|---|
| DE | 004214102 A1 | 12/1992 |
| EP | 0298-211(A) | 1/1989 |
| EP | 0426-303 (A2) | 10/1990 |
| EP | 461-639(A) | 12/1991 |
| JP | 58-96756(A) | 6/1983 |
| JP | 58-112348(A) | 7/1983 |
| JP | 359088863 (A) | 5/1984 |
| JP | 60-254762 (A) | 12/1985 |
| JP | 60254762 | 12/1985 |
| JP | 361047659 (A) | 3/1986 |
| JP | 62-230027 (A) | 8/1987 |
| JP | 4-209562 (A) | 7/1992 |
| JP | 404368167 (A) | 12/1992 |
| JP | 50-29534 (A) | 2/1993 |
| JP | 63-153849 (A) | 6/1998 |
| JP | 2000-88921 | 3/2000 |
| JP | 2000/307029 (A) | 11/2000 |
| JP | 3602000 B2 | 11/2000 |
| JP | 2001/077294 (A) | 3/2001 |
| JP | 2001/085592 (A) | 3/2001 |
| JP | 2001/332683 (A) | 11/2001 |
| JP | 2003/037246 (A) | 2/2003 |
| JP | 2003/086760 (A) | 3/2003 |
| JP | 2003/086761 (A) | 3/2003 |
| JP | 2003-309246 (A) | 10/2003 |
| JP | 2003/309247 (A) | 10/2003 |
| JP | 2003/347475 (A) | 12/2003 |
| JP | 2003/347503 (A) | 12/2003 |
| WO | WO9744824 | 11/1997 |
| WO | WO 99/48140 | 3/1998 |
| WO | WO 03/037053 A1 | 5/2003 |

OTHER PUBLICATIONS

PCT/US2006/017015, International Search Report and Written Opinion dated Oct. 17, 2006.

PCT/US2005/013345, International Preliminary Report on Patentability dated Nov. 2, 2006.

PCT/US2005/016764; International Preliminary Report on Patentability dated Nov. 23, 2006.

PCT/US2005/010756, International Search Report and Written Opinion dated Oct. 12, 2006.

PCT/US2005/010756, International Preliminary Report on Patentability dated Apr. 12, 2007.

PCT/US2005/039307, International Search Report and Written Opinion dated Sep. 26, 2006.
PCT/US2005/013336, International Preliminary Report on Patentability dated Nov. 9, 2006.
Howard W. Markstein, Western Editor, Rigid-Flex: A Maturing Technology datad Feb. 1996, Electronic Packaging & Production.
Design Requirements for Outlines of Solid State and Related Products, Ball Grid Array Package (BGA), Sep. 2005, Jedec Publication 95.
William R. Newberry, Xynetix Design Systems, Inc., Design Techniques for Ball Grid Arrays, 1997 published on the Internet.
Search Report and Written Opinion; mailed Oct. 17, 2006; PCT/US2006/017015.
U.S. Appl. No. 10/400,309, filed Mar. 27, 2003.
U.S. Appl. No. 10/435,192, filed May 9, 2003.
U.S. Appl. No. 10/453,398, filed Jun. 3, 2003.
U.S. Appl. No. 10/457,608, filed Jun. 9, 2003.
U.S. Appl. No. 10/624,097, filed Jul. 21, 2003.
U.S. Appl. No. 10/804,452, filed Mar. 19, 2004.
U.S. Appl. No. 10/814,530, filed Mar. 31, 2004.
U.S. Appl. No. 10/828,495, filed Apr. 20, 2004.
U.S. Appl. No. 10/836,855, filed Apr. 30, 2004.
U.S. Appl. No. 10/845,029, filed May 13, 2004.
U.S. Appl. No. 10/872,897, filed Jun. 21, 2004.
U.S. Appl. No. 10/913,220, filed Aug. 6, 2004.
U.S. Appl. No. 10/917,216, filed Aug. 12, 2004.
U.S. Appl. No. 10/931,828, filed Sep. 1, 2004.
U.S. Appl. No. 10/940,074, filed Sep. 14, 2004.
U.S. Appl. No. 10/956,442, filed Oct. 1, 2004.
U.S. Appl. No. 10/958,584, filed Oct. 5, 2004.
U.S. Appl. No. 10/958,924, filed Oct. 5, 2004.
U.S. Appl. No. 10/958,934, filed Oct. 5, 2004.
U.S. Appl. No. 10/963,867, filed Oct. 12, 2004.
U.S. Appl. No. 10/978,149, filed Oct. 29, 2004.
U.S. Appl. No. 11/003,168, filed Dec. 3, 2004.
U.S. Appl. No. 11/015,521, filed Dec. 17, 2004.
U.S. Appl. No. 11/039,615, filed Jan. 20, 2005.
U.S. Appl. No. 11/040,564, filed Jan. 21, 2005.
U.S. Appl. No. 11/051,815, filed Feb. 4, 2005.
U.S. Appl. No. 11/116,981, filed Apr. 28, 2005.
U.S. Appl. No. 11/131,812, filed May 18, 2005.
U.S. Appl. No. 11/173,445, filed Jul. 1, 2005.
U.S. Appl. No. 11/175,562, filed Jul. 5, 2005.
U.S. Appl. No. 11/197,267, filed Aug. 4, 2005.
U.S. Appl. No. 11/221,597, filed Sep. 7, 2005.
U.S. Appl. No. 11/258,438, filed Oct. 25, 2005.
U.S. Appl. No. 11/316,505, filed Dec. 21, 2005.
U.S. Appl. No. 11/403,081, filed Apr. 12, 2006.
U.S. Appl. No. 11/411,185, filed Apr. 25, 2006.
U.S. Appl. No. 11/432,206, filed May 11, 2006.
U.S. Appl. No. 11/556,124, filed Nov. 2, 2006.
U.S. Appl. No. 11/626,318, filed Jan. 23, 2007.
U.S. Appl. No. 11/626,316, filed Jan. 23, 2007.
Flexible Printed Circuit Technology—A Versatile Interconnection Option (Website 2 pages) Fjeistad, Joseph. Dec. 3, 2002.
Die Products: Ideal IC Packaging for Demanding Applications—Advanced packaging that's no bigger than the die itself brings together high performance and high reliability with small size and low cost (Website 3 pages with 2 figures) Larry Gilg and Chris Windsor. Dec. 23, 2002 Published on Internet.
Tessera uZ Ball Stack Package. 4 figures that purport to be directed to the uZ—Ball Stacked Memory, Published on the Internet.
Chip Scale Review Online—An Independent Journal Dedicated to the Advancement of Chip-Scale Electronics (Webiste 9 pages) Fjelstad, Joseph, Pacific Consultants L.L.C., Published Jan. 2001 on Internet.
Flexible Thinking: Examining the Flexible Circuit Tapes (Website 2 pages) Fjelstad, Joseph., Published Apr. 20, 2000 on Internet.
Ron Bauer, Intel. "Stacked-CSP Delivers Flexibility, Reliability, and Space-Saving Capabilities", vol. 3, Spring 2002, Published on the Internet.
Tessera Technologies, Inc.—Semiconductor Intellectual Property, Chip Scale Packaging—Website pp. (3), Internet.
Tessera Introduces uZ a—Ball Stacked Memory Package for Computing and Portable Electronic Products Joyce Smaragdis, Tessera Public Relations, Sandy Skees, MCA PR (www.tessera.com/news_events/press_coverage.cfm): 2 figures that purport to be directed to the uZ a—Ball Stacked Memory Package. Published Jul. 17, 2002 in San Jose, CA.
William R. Newberry, Design Techniques for Ball Grid Arrays, Xynetix Design Systems, Inc., Portland, Maine, Published on the Internet.
Chip Scale Packaging and Redistribution, Paul A. Magill, Glenn A. Rinne, J Daniel Mis, Wayne C Machon, Joseph W. Baggs, Unitive Electronics Inc.
Dense-Pac Microsystems, 16 Megabit High Speed CMOS SRAM DPS1MX16MKn3.
Dense-Pac Microsystems, 256 Megabyte CMOS DRAM DP3ED32MS72RWS.
Dense-Pac Microsystems, Breaking Space Barriers, 3-D Technology 1993.
Dense-Pac Microsystems, DPS512X16A3, Ceramic 512K×16 CMOS SRAM Module.
IBM Preliminary 168 Pin SDRAM Registered DIMM Functional Description & Timing Diagrams.
3D Interconnection for Ultra-Dense Multichip Modules, Christian VAL, Thomson-CSF DCS Computer Division, Thierry Lemoine, Thomson-CSF RCM Radar Countermeasures Divison.
High Density Memory Packaging Technology High Speed Imaging Applications Dean Frew, Texas Instruments Incorporated.
Vertically-Intergrated Packaging, Alvin Weinberg, Pacesetter, Inc. and W. Kinzy Jones, Florida International University.
1992 Proceedings, 42nd Electronic Components & Technology Conference, May 18-20, 1992.
Research Disclosure, Organic Card Device Carrier, 31318, May 1990, No. 313.
IBM Technical Disclosure Bulletin, vol. 23, No. 12, May 1981.
IBM Technical Disclosure Bulletin, vol. 20, No. 11A, Apr. 1978.
IBM Technical Disclosure Bulletin, vol. 32, No. 38, Aug. 1989.
Orthogonal Chip Mount—A 3D Hybrid Water Scale Integration Technology, International Electron Device Meeting, IEDM Technical Digest, Washington, D.C., Dec. 6-9, 1987.

* cited by examiner

STACKED MODULE SYSTEMS

RELATED APPLICATIONS

This application is a continuation-in-part of U.S. patent application Ser. No. 10/958,584, filed Oct. 5, 2004, pending, which is a continuation of U.S. patent application Ser. No. 10/136,890, filed May 2, 2002, now U.S. Pat. No. 6,940,729 B2, issued Sep. 6, 2005, each of which is incorporated herein by reference.

This application also is a continuation-in-part of U.S. patent application Ser. No. 10/873,847, filed Jun. 22, 2004, now U.S. Pat. No. 7,094,632, which is a continuation of U.S. patent application Ser. No. 10/631,886, filed Jul. 11, 2003, now U.S. Pat. No. 7,026,708, which is a continuation-in-part of U.S. patent application Ser. No. 10/453,398, filed Jun. 3, 2003, now U.S. Pat. No. 6,914,324 B2, issued Jul. 5, 2005, which is a continuation-in-part of U.S. patent application Ser. No. 10/005,581, filed Oct. 26, 2001, now U.S. Pat. No. 6,576,992 B2, issued Jun. 10, 2003, each of which is incorporated herein by reference. U.S. patent application Ser. No. 10/631,886 also is a continuation-in-part of U.S. patent application Ser. No. 10/457,608, filed Jun. 9, 2003, now abandoned, which is a continuation-in-part of U.S. patent application Ser. No. 10/005,581, filed Oct. 26, 2001, now U.S. patent application Ser. No. 6,576,992 B2, issued Jun. 10, 2003. U.S. patent application Ser. No. 10/457,608 is incorporated herein by reference.

TECHNICAL FIELD

The present invention relates to aggregating integrated circuits and, in particular, to stacking integrated circuits using flex circuitry.

BACKGROUND

A variety of techniques are used to stack packaged integrated circuits. Some methods require special packages, while other techniques stack conventional packages.

The predominant package configuration employed during the past two decades has encapsulated an integrated circuit in a plastic surround typically having a rectangular configuration. The enveloped integrated circuit is connected to the application environment through leads emergent from the edge periphery of the plastic encapsulation. Such "leaded packages" have been the constituent elements most commonly employed by techniques for stacking packaged integrated circuits.

Leaded packages play an important role in electronics, but efforts to miniaturize electronic components and assemblies have driven development of technologies that preserve circuit board surface area. Because leaded packages have leads emergent from peripheral sides of the package, leaded packages occupy more than a minimal amount of circuit board surface area. Consequently, alternatives to leaded packages known as chip scale packages or "CSPs" have recently gained market share.

A commonly used style of CSP provides connection to a packaged integrated circuit through a set of contacts (often embodied as "bumps" or "balls") arrayed across a major surface of the package. Instead of leads emergent from a peripheral side of the package, contacts are placed on a major surface and typically emerge from the bottom surface of the package.

The absence of "leads" on package sides renders most of the conventional stacking techniques devised for leaded packages inapplicable for CSP stacking. Frequently, CSP stacking provides one or more flex circuits interconnecting the contacts of respective CSPs. Also, CSP stacking may more often dispose one CSP bonded to another CSP of the stack. Conventional stacking techniques devised for leaded packages also often are inadequate for stacking integrated circuits packaged in different forms, such as a stack comprising both CSPs and leaded packages.

A variety of previous techniques for stacking CSPs and mixed integrated circuit packages may present complex assembly problems. Therefore, a technique and system is needed for stacking CSPs that provides a thermally-efficient, reliable structure allowing efficient production at reasonable cost with readily understood and managed materials and methods.

SUMMARY

The present invention stacks integrated circuit packages into modules that conserve PWB or other board surface area and prepares units containing integrated circuit packages for such stacking. Although the present invention is applied most frequently to CSPs that contain one die, it may be employed with CSPs and other integrated circuit packages that include more than one integrated circuit die. Multiple numbers of integrated circuit packages may be stacked in accordance with the present invention. The integrated circuit packages employed in stacked modules devised in accordance with the present invention are connected with flex circuitry that may exhibit one or two or more conductive layers.

In accordance with a preferred embodiment, a combination comprising a form standard and a CSP is attached to flex circuitry. Solder paste is applied to first selected locations on the flex circuitry and primary adhesive is applied to second selected locations on the flex circuitry. Supplemental adhesive is applied to additional locations on the flex circuitry, CSP, form standard, or other component of the combination. The flex circuitry and the combination of the form standard and CSP are brought into proximity with each other. During solder reflow operation, a force is applied that tends to bring the combination and flex circuitry closer together. As the heat of solder reflow melts the contacts of the CSP, the combination collapses toward the flex circuitry displacing the primary adhesive and the supplemental adhesive as the solder paste and contacts merge into solder joints. In a preferred embodiment, the form standard will be devised of heat transference material, a metal, for example, such as copper would be preferred, to improve thermal performance. In other preferred embodiments, a CSP without a form standard is attached to flex circuitry. The supplemental adhesive establishes a bond providing additional support to the flex circuitry.

In another embodiment, CSPs or other integrated circuit packages are bonded to each other or to other components with a combination of adhesives. A rapid bond adhesive maintains alignment of the bonded packages and/or components during assembly, and a structural bond adhesive provides additional strength and/or structural integrity to the bond.

DESCRIPTION OF PREFERRED EMBODIMENTS

Although several embodiments are described herein, the present invention can be used to advantage with CSPs or leaded packages of a variety of sizes and configurations ranging from larger packaged base elements having many dozens of contacts to smaller packages including, for example, packages approaching the size of the die such as die-sized ball grid array packages. Although the present invention is applied most frequently to packages that contain one die, it may be employed with packages that include more than one integrated circuit die.

Figure 1A:
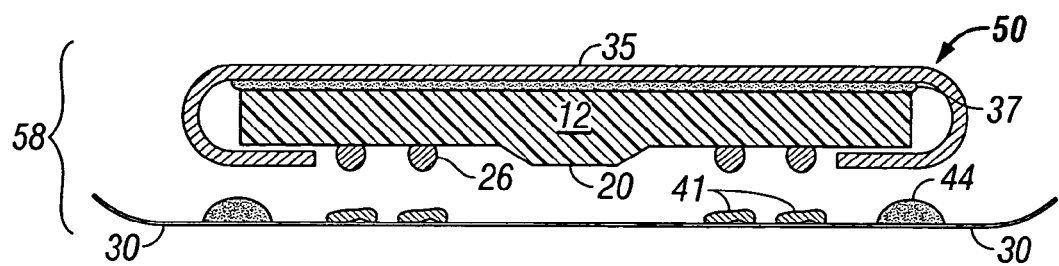
FIGS. 1A-1D depict known construction of a unit for a circuit module and issues relating to such construction.
Figure 1B:
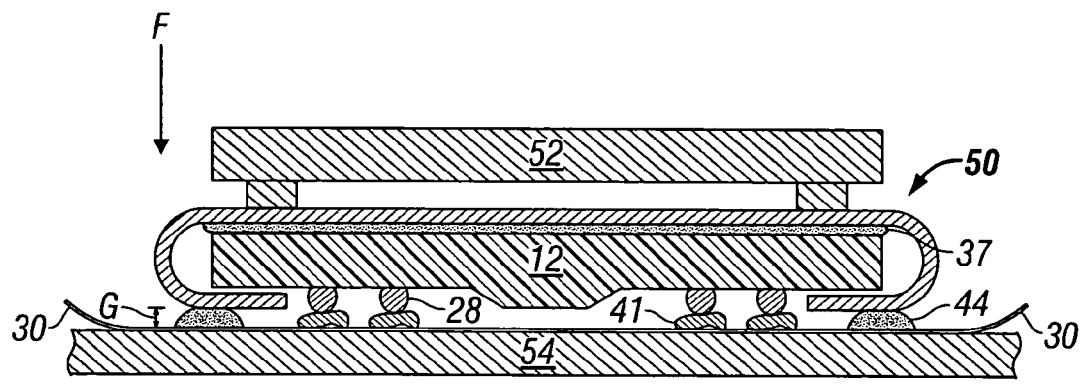
Figure 1C:
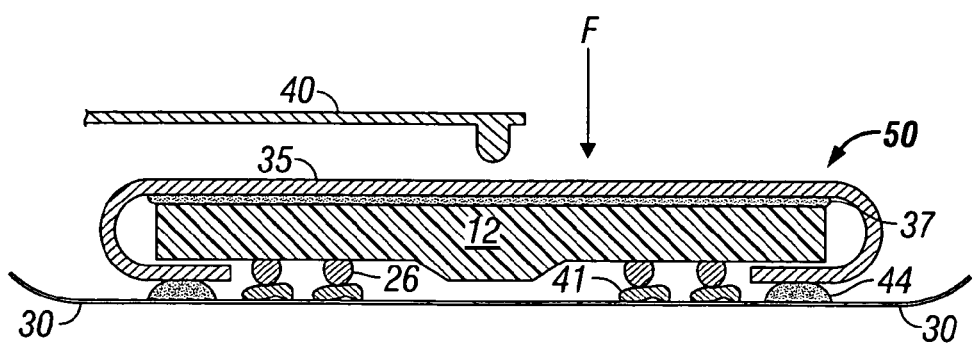

FIGS. 1A-1C depict the construction of an exemplary unit 58 in accordance with a preferred embodiment for stacking in a circuit module. Form standard 35 is devised to be employed with a CSP in the disclosed embodiment to provide a standard form for flex circuitry. Form standard 35 is attached to the upper major surface 18 of CSP 12 with adhesive 37 and partially wraps around lateral edges of CSP to form a primary combination 50. In respective preferred embodiments, adhesive 37 is a thermoset adhesive or epoxy that will not soften during subsequent reflow operations such as exposure to 200-250 degrees Centigrade, for example. Unit 58 in the depicted embodiment comprises primary combination 50 and flex circuitry 30.

The depicted configuration of form standard 35 is just one of many that can provide a standard form about which flex circuitry may be disposed. Use of a form standard allows a connective design implemented in flex circuitry to be used with CSPs of a variety of designs and configurations. Form standard 35 may also provide thermal advantages particularly when devised from metallic materials such as copper and copper alloys for example. Other configurations of form standard 35 may be employed with the present invention including but not limited to those that extend across the bottom surface 20 of CSP 12. Further, some form standards may not extend beyond the perimeter of CSP 12. Still other embodiments of the invention may affix flex circuitry to CSP bodies without employing a form standard, and the flex circuitry may partially wrap about a lateral edge of the CSP as shown for example in FIGS. 5 and 6.

The flex circuitry in this embodiment comprises a contiguous flex circuit 30, but other embodiments may use two or several flex circuits. In addition, the flex circuitry may be flexible throughout or flexible in some areas and rigid in other areas. Flex circuitry in various embodiments may have one or two or more conductive layers, and also may have one or more outer layers and/or intermediate layers. Flex circuitry has solder paste 41 applied at selected sites. In the illustrated embodiments, primary adhesive 44 is also applied at selected sites on the flex circuitry that are proximal to the lateral edge of lower major surface 20 of CSP 12.

In FIG. 1B, the primary combination 50 and the flex circuitry have been disposed in proximity to each other. Typically, there will be contact between contacts 26 and solder paste 41, but a large gap "G" between flex circuitry and form standard 35 will be exhibited because primary combination 50 is suspended above flex circuit 30 by primary adhesive 44 and the uncompressed height of contacts 26 and solder paste 41. Weight 52 is disposed above CSP 12 on primary combination 50 while flex circuit 30 is supported from beneath by work support 54. Work support 54 is preferably a carrier that is in motion through an assembly process or may be stationary. Primary combination 50 and the flex circuitry are subjected to a solder reflow operation, examples of which are well known to those of skill in the art.

With primary combination 50 and flex circuit 30 under force F which tends to move them closer together, primary combination 50 collapses toward the flex circuitry as contacts 26 melt in the solder reflow operation and merge with the solder paste on flex circuit 30 to form solder joints 56 as primary adhesive 44 is compressed as well. As a result of such compression, primary adhesive 44 comes in contact with form standard 35 and disposes form standard adhesive bonds on form standard 35 comprising primary adhesive 44 along a line approximately parallel to the lateral edges of lower major surface 20. In respective preferred embodiments, primary adhesive 44 cures after the solder has melted.

After appreciating this specification, those of skill will recognize that force F may be applied by several methods and apparatus including weights and fixtures that apply force F during the reflow operation that melts contacts 26. For example, an alternate system using a fixture 40 to apply force F is shown in FIG. 1C. These processes are amenable to implementation in standard pick and place operations known in the art.

As shown in FIGS. 1A-1C, portions of flex circuitry 30 may be partially wrapped about form standard 35 and, preferably, bonded by primary adhesive to the upper surface of form standard 35. In such wrapped configuration, flex circuitry 30 also becomes partially wrapped about lateral sides of lower major surface 20 of CSP 12. Flex circuitry 30 disposed in such wrapped configuration may express contacts to connect with contacts 26 of another unit 58 or contacts of another CSP or leaded package integrated circuit. Details of such wrapping and connecting methods and structures are not repeated, but are disclosed, for example, by U.S. Pat. No. 6,576,992 B1, No. 6,914,324 B2, and No. 6,940,729 B2, each of which is incorporated herein by reference.

Figure 1D:
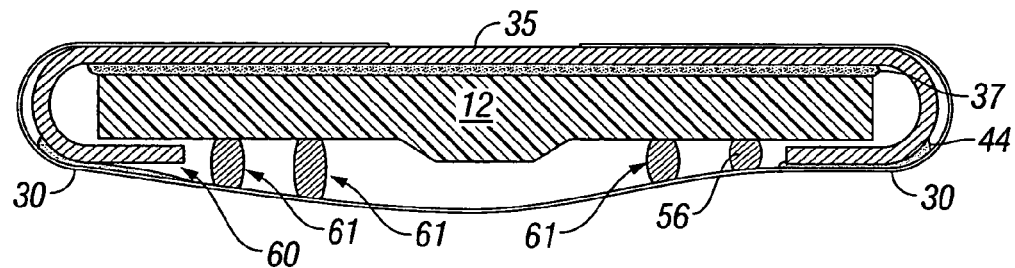

FIG. 1D depicts a unit 58 devised in accordance the described methods and comprising CSP 12, form standard 35, and flex circuitry 30. FIG. 1D illustrates an adhesive failure 60 at the bond between flex circuitry 30 and form standard 35. Adhesive failures may be caused by handling and manufacturing variances during the production process. An adhesive failure 60 may allow relaxation of flex circuitry 30 and distorted solder joints 61, which in turn may cause undesirable deviation from coplanarity of a circuit module or its components.

The use of supplemental adhesive provides additional support to the flex circuitry configuration. Various advantages may result from such additional support, such as an increase in the integrity of component alignment in case of an adhesive failure.

Figure 2:
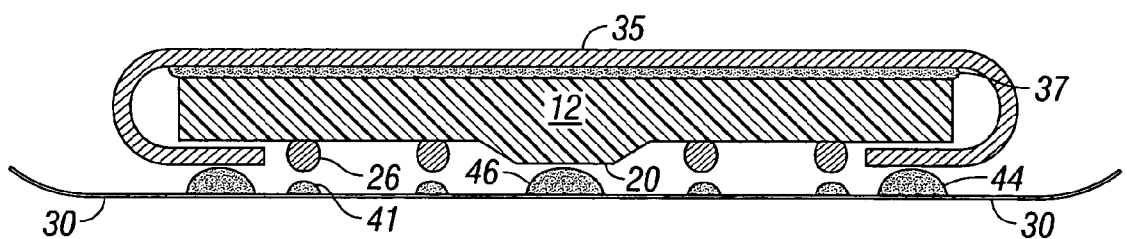
FIG. 2 depicts selected steps in a method for construction of a unit for a circuit module in accordance with a preferred embodiment of the present invention.
Figure 3:
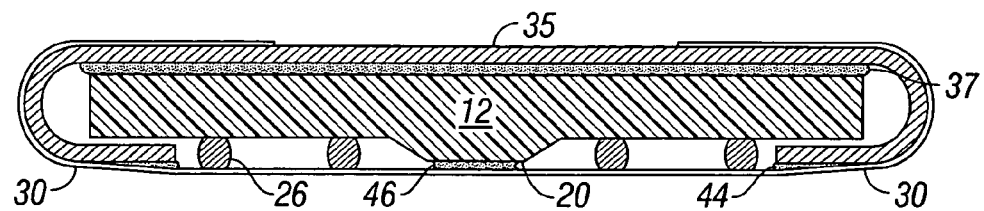
FIG. 3 depicts a unit for a circuit module in accordance with a preferred embodiment of the present invention.

FIG. 2 depicts a preferred embodiment in which supplemental adhesive 46 is disposed between CSP 12 and flex circuitry 30 and between sets of contacts 26 so that the supplemental adhesive bonds formed by supplemental adhesive 46 are distal from and between the primary adhesive bonds formed by primary adhesive 44. In the illustrated embodiment, supplemental adhesive is disposed along a line approximately parallel to the lateral edges of lower major surface 20. Supplemental adhesive 46 can be the same adhesive used for primary adhesive 44 or a different adhesive, but preferably will allow solder reflow without interfering with the geometry of solder joints 56, for example by curing after solder joints 56 have formed and stabilized. FIG. 3 depicts unit 58 of such embodiment fully assembled for stacking.

Figure 4A:
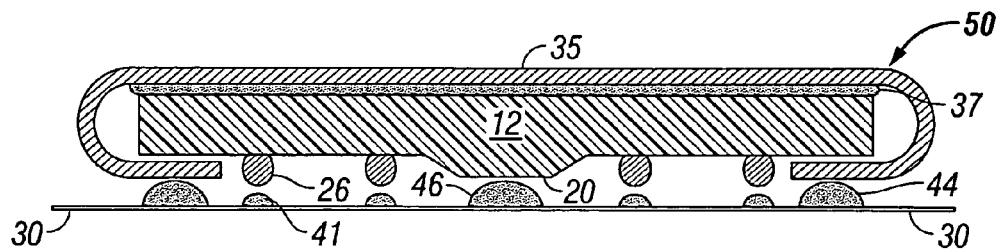
FIGS. 4A and 4B depict selected steps in a method for construction of a unit for a circuit module in accordance with a preferred embodiment of the present invention.
Figure 4B:
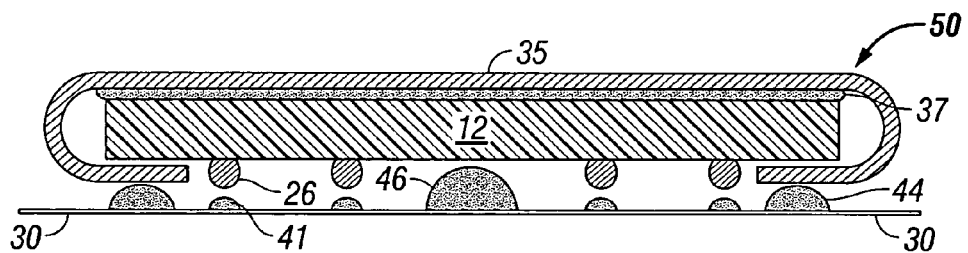

Depending on the configuration of integrated circuit package 12, contacts 26, flex circuitry 30, and other components that may be comprised in unit 58, those of skill in the art will appreciate that the quantity of supplemental adhesive 46 can be varied according to the desired volume of the supplemental bond with the flex circuit. For example, FIG. 4A depicts the use of a lesser quantity of supplemental adhesive 46 to fill the smaller gap between the overmold disposed on lower major surface 20 of CSP 12 and the flex circuitry 30 of the illustrated embodiment, compared with FIG. 4B that depicts the use of a greater quantity of supplemental adhesive 46 to fill the larger gap between the planar lower major surface 20 of CSP 12 and the flex circuitry 30 of that illustrated embodiment. For further example, similar variations in the quantity of supplemental adhesive 46 may be appropriate to accommodate variations in the heights of solder joints 56. Those of skill in the art further will appreciate that other or additional locations may be available at which the use of varying amounts and types of supplemental adhesive in accordance with the invention disclosed herein may increases the integrity of component alignment in case of an adhesive failure.

Figure 5:
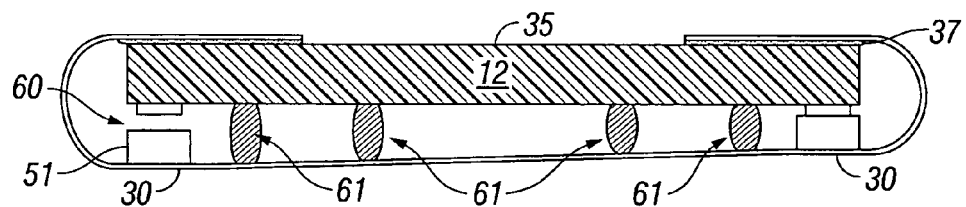
FIG. 5 depicts known issues concerning construction of a unit for a circuit module.
Figure 6:
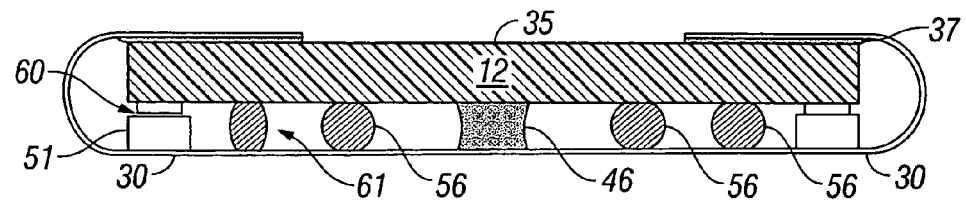
FIG. 6 depicts a unit for a circuit module in accordance with a preferred embodiment of the present invention.

As depicted for example in FIG. 5, stiffeners 51 may be used for embodiments that do not deploy a form standard such as form standard 35 of FIGS. 1-4. As shown in FIGS. 5 and 6, the flex circuitry in the disclosed embodiments partially wraps around lateral edges of lower major surface 20 of CSP 12, and primary adhesive 44 is disposed proximal to such lateral edges. In such embodiments, an adhesive failure may occur at the bond between a stiffener 51 and CSP 12, as depicted for example in FIG. 5. FIG. 6 illustrates the deployment of supplemental adhesive 46 proximal to lower major surface 20 of CSP 12 but distal from the bond of primary adhesive 44 in accordance with a preferred embodiment of the present invention, and the resulting improvement in the geometry of distorted solder joints 61 and the coplanarity of flex circuitry 30 and CSP 12.

Figure 7A:
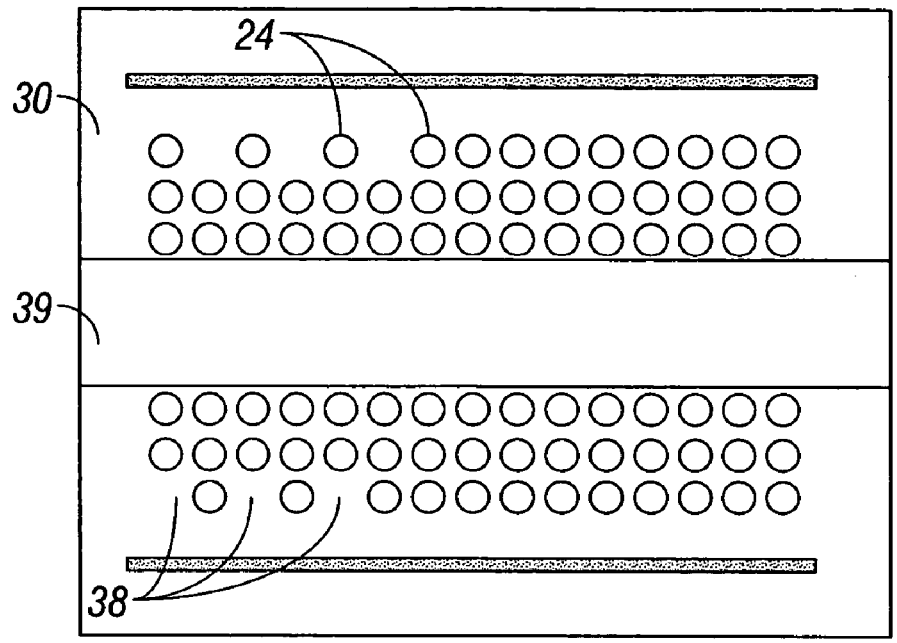
FIG. 7A depicts a known configuration for flex circuitry for a circuit module.

In various circuit module configurations, one or more integrated circuit packages may have depopulated contact locations or deactivated contacts that can be removed to create depopulated contact locations. Flex circuitry on which such integrated circuit packages are mounted may have populated and depopulated contact locations corresponding to the contacts of such integrated circuit packages. In addition or alternatively, the flex circuitry may have vacant areas disposed proximal to an integrated circuit package or other rigid component. For example, FIG. 7A discloses an embodiment having flex circuitry 30 having two contact arrays, each 3 by 15 in dimension. Also shown on flex circuitry 30 are various contact array locations populated with contacts 24, various contact array locations 38 having no contacts and thus depopulated of contacts, and vacant area 39 between the respective contact arrays.

Figure 7B:
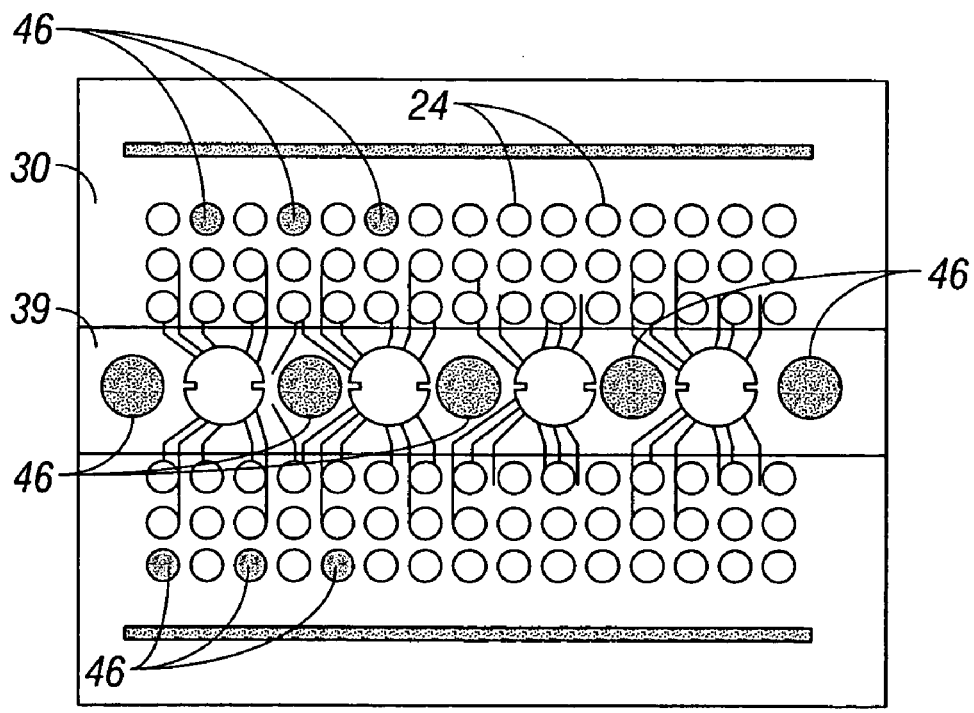
FIG. 7B depicts a flex circuitry configured in accordance with a preferred embodiment of the present invention.
Figure 8:
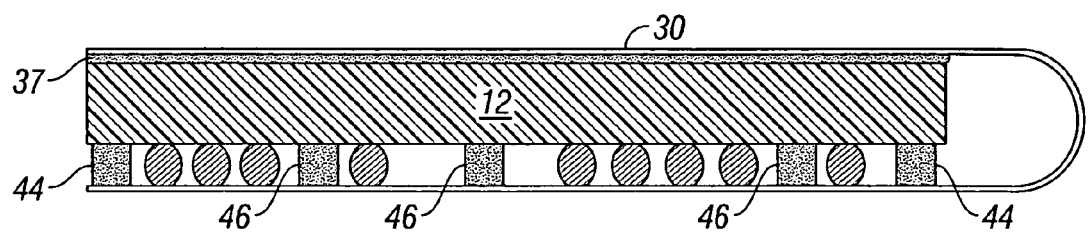
FIG. 8 depicts a portion of a unit for a circuit module in accordance with a preferred embodiment of the present invention.

FIG. 7B depicts supplemental adhesive 46 disposed on flex circuitry 30 in accordance with a preferred embodiment of the present invention. In the illustrated embodiment, supplemental adhesive 46 is disposed to form supplemental adhesive bonds on vacant area 39 of flex circuitry 30 between the respective contact arrays and locations 38 of flex circuitry 30 depopulated of contacts. FIG. 8 depicts a side view of such embodiment.

Circuit modules frequently have components bonded together by an adhesive. Previous configurations of such circuit modules know in the art use bonds that comprised only a thermoset adhesive film or epoxy. Such configurations typically require components to clamped or otherwise held under load during thermal cure of the adhesive or epoxy, which could be a slow and complicated process. Alternate configurations using an adhesive that sets or cures rapidly typically exhibit adhesive bonds having undesirable flexibility, elasticity, or compliance at transient or operating temperatures.

In various embodiments of the invention, a circuit module has bonded components in which the bond comprises plural adhesive types. For example, various embodiments disclosed herein bond components with a rapid bond adhesive and a structural bond adhesive. Such embodiments may be employed to advantage with many of the wide range of CSP and leaded package configurations available in the art. Modules in accordance with various preferred embodiments of the present invention may comprise plural base elements exclusively, as in a memory circuit module having plural memory integrated circuit packages as base elements 12, or may comprise one or more base elements deployed with support elements, as in a system circuit module having a microprocessor as base element 12 and memory and other support circuitry packaged in a variety of configurations as support elements depicted in FIGS. 9D, 9F, and 9G for example as support elements 14 and 16. Those of skill in the art will readily appreciate, that the invention can employed to advantage with a variety of combinations of packages including leaded packages and CSPs and other configurations of packaged ICs.

Figure 9A:
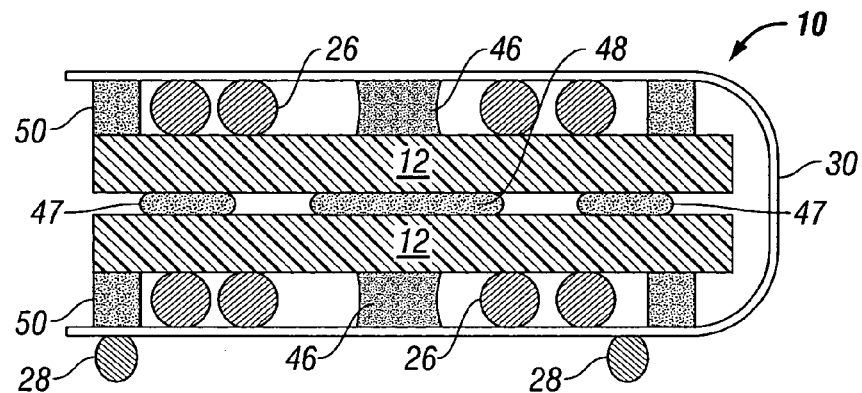
FIGS. 9A-9G depict circuit modules in accordance with several preferred embodiments of the present invention.

FIG. 9A depicts a preferred embodiment of the present invention having two base elements 12 disposed in a stacked configuration connected by flex circuitry 30. As discussed above, in this embodiment supplemental adhesive 46 is disposed as indicated between flex circuitry 30 and each of base elements 12. Base elements 12 are bonded in this embodiment by rapid bond adhesive 47 and structural bond adhesive 48, as more fully discussed below with respect to FIGS. 10-15.

Figure 9B:
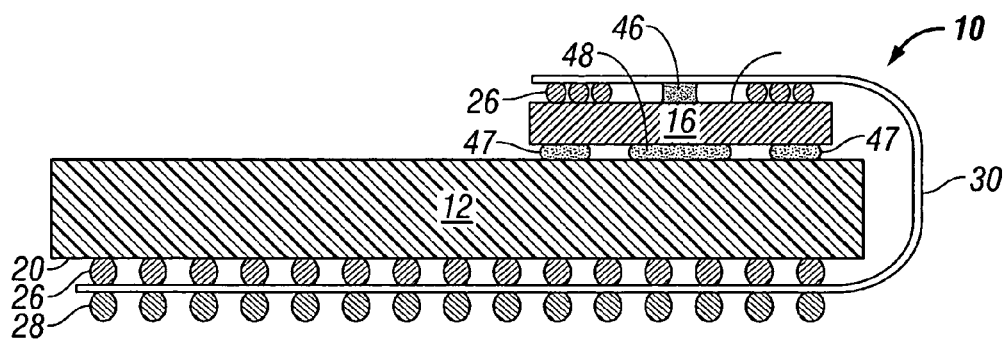

FIG. 9B depicts a preferred embodiment of the present invention having base element 12 and a CSP support element 16 disposed in a stacked configuration on upper major surface 18 of base element 12. As discussed above, in this embodiment supplemental adhesive 46 is disposed to bond base element 12 and support element 16, respectively, to flex circuitry 30. Although supplemental adhesive 46 disposed to bond base element 12 to flex circuitry 30 is not illustrated in FIG. 9B, those of skill in the art will appreciate its configuration from the disclosure above. Base element 12 and support element 16 are bonded in this embodiment by rapid bond adhesive 47 and structural bond adhesive 48, as more fully discussed below with respect to FIGS. 10-15.

Figure 9C:
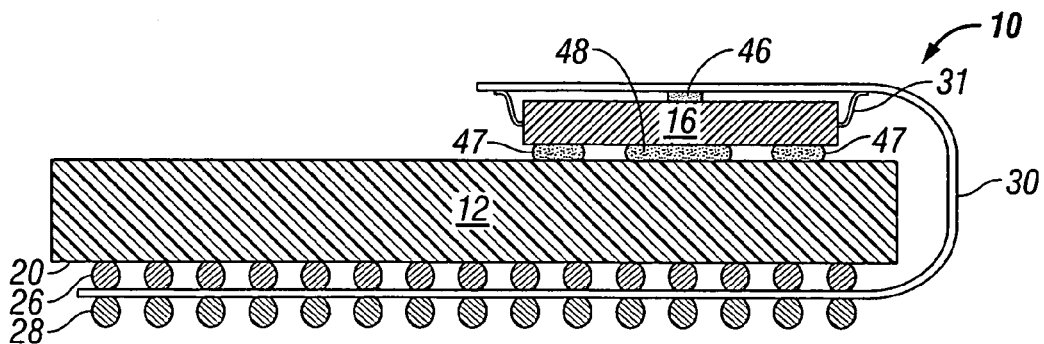

FIG. 9C depicts a preferred embodiment of the present invention in which a base element 12 is disposed in a stacked configuration with a leaded support element 16. As discussed above, in this embodiment supplemental adhesive 46 is disposed to bond base element 12 and support element 16, respectively, to flex circuitry 30. Although supplemental adhesive 46 disposed to bond base element 12 to flex circuitry 30 is not illustrated in FIG. 9C, those of skill in the art will appreciate its configuration from the disclosure above. Base element 12 and support element 16 are bonded in this embodiment by rapid bond adhesive 47 and structural bond adhesive 48, as more fully discussed below with respect to FIGS. 10-15.

Figure 9D:
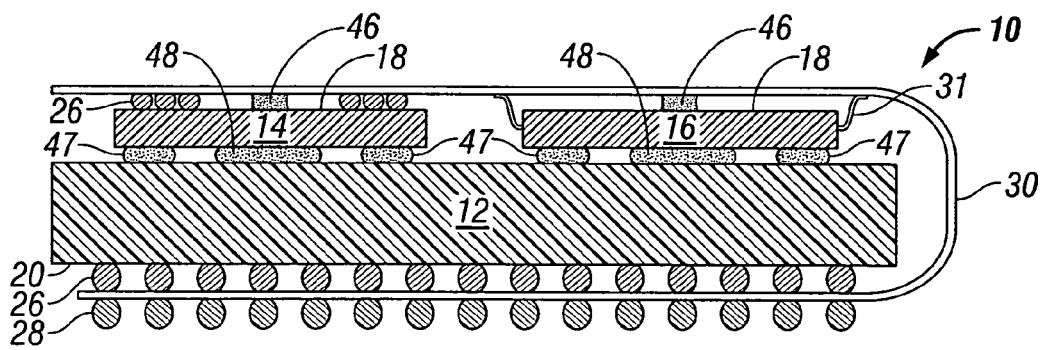

FIG. 9D depicts a circuit module 10 devised in accordance with a preferred embodiment of the invention comprising base element 12 disposed in a stacked configuration with support elements 14 and 16. This embodiment aggregates base element 12 and support element 14 each deployed as CSPs with support element 16 deployed as a leaded package device having leads 31. In accordance with the discussion above, in this embodiment supplemental adhesive 46 is disposed to bond base element 12, support element 14, and support element 16, respectively, to flex circuitry 30. Although supplemental adhesive 46 disposed to bond base element 12 to flex circuitry 30 is not illustrated in FIG. 9D, those of skill in the art will appreciate its configuration from the disclosure above. Base element 12 is bonded to support element 14 and support element 16, respectively, by rapid bond adhesive 47 and structural bond adhesive 48, as more fully discussed below with respect to FIGS. 10-15.

Figure 9E:
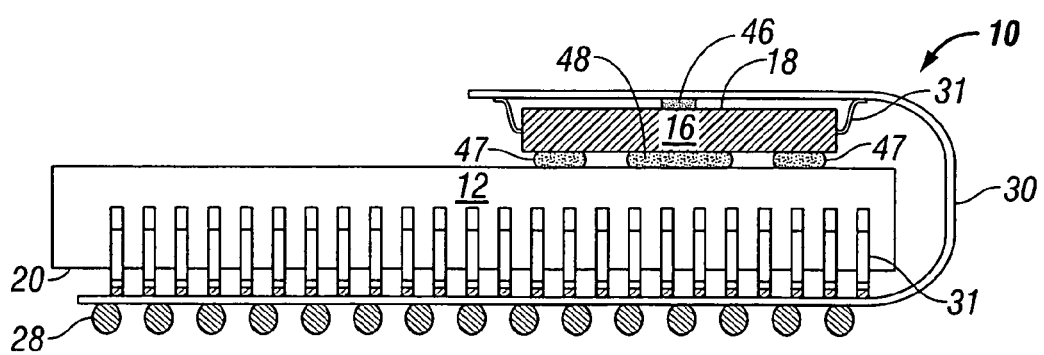

FIG. 9E depicts an alternative preferred embodiment of the invention employed to aggregate leaded packages. Depicted base element 12 and support element 16 are each deployed as a leaded package device having leads 31. In accordance with the discussion above, in this embodiment supplemental adhesive 46 is disposed to bond base element 12 and support element 16, respectively, to flex circuitry 30. Although supplemental adhesive 46 disposed to bond base element 12 to flex circuitry 30 is not illustrated in FIG. 9B, those of skill in the art will appreciate its configuration from the disclosure above. Base element 12 and support element 16 are bonded in this embodiment by rapid bond adhesive 47 and structural bond adhesive 48, as more fully discussed below with respect to FIGS. 10-15.

Figure 9F:
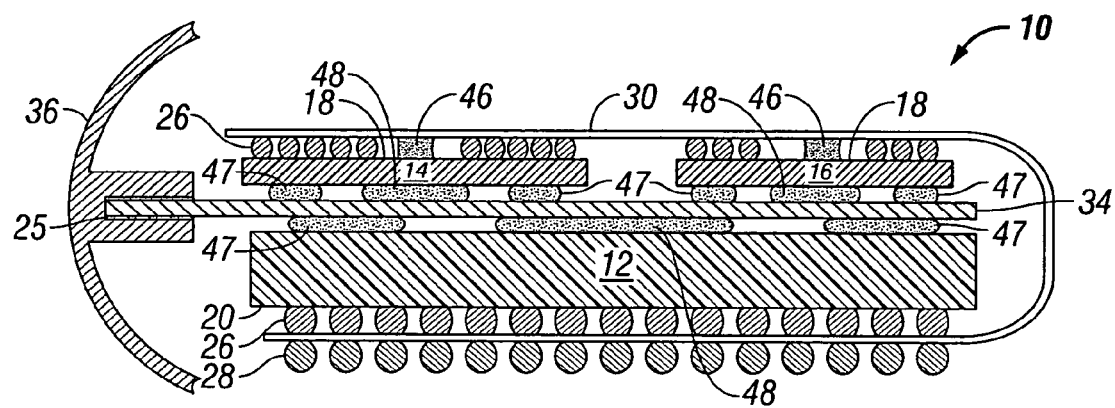

FIG. 9F depicts a preferred embodiment of the present invention that employs a CSP base element 12 and CSP support elements 14 and 16. Heat spreader 34 is disposed between base element 12 and support elements 14 and 16. As depicted in FIG. 9F, heat spreader 34 is in contact with a portion of casing 36 of an environment in which circuit module 10 is deployed. As discussed above, in this embodiment supplemental adhesive 46 is disposed to bond base element 12, support element 14, and support element 16, respectively, to flex circuitry 30. Although supplemental adhesive 46 disposed to bond base element 12 to flex circuitry 30 is not illustrated in FIG. 9F, those of skill in the art will appreciate its configuration from the disclosure above. Each of base element 12, support element 14, and support element 16 are respectively bonded to heat spreader 34 by rapid bond adhesive 47 and structural bond adhesive 48, as more fully discussed below with respect to FIGS. 10-15.

Figure 9G:
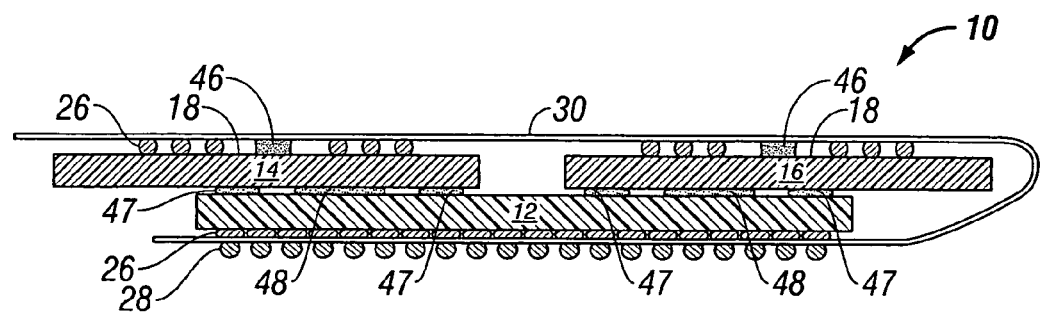

FIG. 9G depicts base element 12 and support elements 14 and 16 each deployed as CSPs, with support elements 14 and 16 extending beyond the physical boundaries of base element 12. As discussed above, in this embodiment supplemental adhesive 46 is disposed to bond base element 12, support element 14, and support element 16, respectively, to flex circuitry 30. Although supplemental adhesive 46 disposed to bond base element 12 to flex circuitry 30 is not illustrated in FIG. 9G, those of skill in the art will appreciate its configuration from the disclosure above. Base element 12 is bonded to support element 14 and support element 16, respectively, by rapid bond adhesive 47 and structural bond adhesive 48, as more fully discussed below with respect to FIGS. 10-15.

Figure 10:
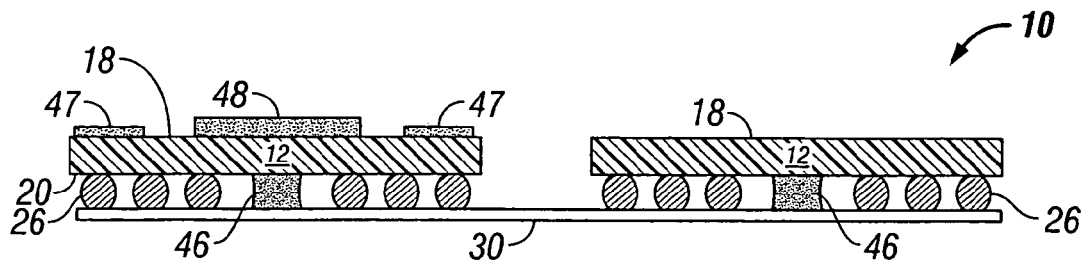
FIG. 10 depicts selected steps in a method for construction of a circuit module in accordance with a preferred embodiment of the present invention.
Figure 11:
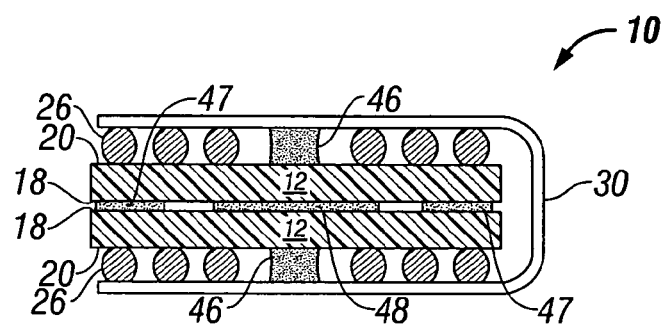
FIG. 11 depicts circuit module in accordance with a preferred embodiment of the present invention.

FIGS. 10 and 11 depict a preferred embodiment of a circuit module having bonded components in which the bond comprises plural adhesive types. In this embodiment, plural CSPs 12 are connected to flex circuitry 30 using supplemental adhesive 46 as discussed above. A rapid bond adhesive 47 and a structural bond adhesive 48 are applied to the upper major surface 18 of a CSP 12 as indicated, thus resulting in the disposition of respective adhesive bonds. Flex circuitry 30 is folded so that upper major surfaces 18 of each CSP 12 are adjacent and brought into contact as shown in FIG. 11 under an initial application of force sufficient to bond CSPs 12 with rapid bond adhesive 47. Accordingly, additional adhesive bonds are disposed on CSP 12 not receiving the initial application of rapid bond adhesive 47 and a structural bond adhesive 48. While CSPs 12 are held in such configuration by rapid bond adhesive 47, structural bond adhesive 48 is allowed to set or cure and create another bond between CSPs 12.

Rapid bond adhesive 47 preferably is a pressure sensitive adhesive that quickly forms a bond and maintains the bond during successive solder reflow operations used to form high-temperature solder joints, sources of which are known in the art. Structural bond adhesive 48 preferably is thermoplastic bonding film with high shear and peel strength, sources of which also are known in the art. During assembly the application of heat and the termoplastic properties of such structural bond adhesive 48 allow structural bond adhesive 48 to conform to and fill bounded volumes defined by rapid bond adhesive 47 and/or other structures. In addition, components can be debonded with the application of heat and force to perform any required rework of the circuit module. Accordingly, embodiments using such types of rapid bond adhesive 47 and structural bond adhesive 48 offer quick and uncomplicated assembly along with a more stable and rigid bond at transient or operating temperatures.

Figure 12:
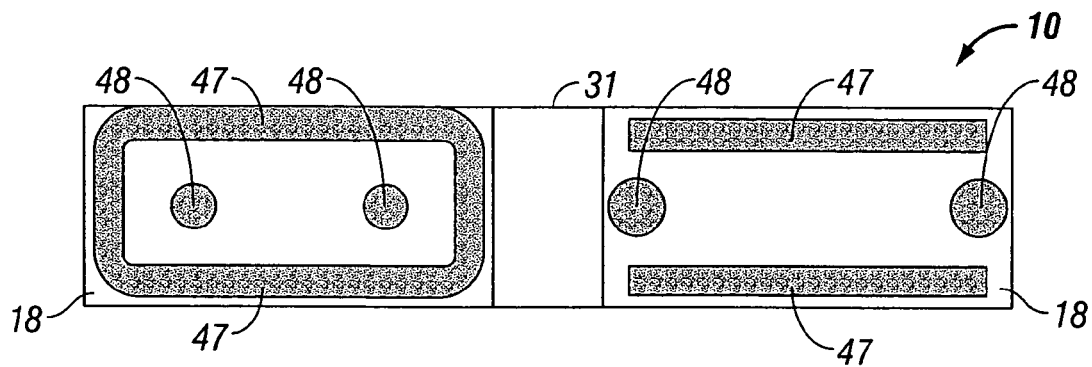
FIGS. 12 and 13 depict selected configurations of adhesive in accordance with selected preferred embodiments of the present invention.

FIG. 12 depicts additional preferred embodiments of the invention. In each of these embodiments, rapid bond adhesive 47 is applied to the upper major surface 18 of a CSP 12 as indicated, resulting in the disposition of an adhesive bond. Again, rapid bond adhesive 47 preferably is a pressure sensitive adhesive that quickly forms a bond and maintains the bond during successive solder reflow operations used to form high-temperature solder joints. Structural bond adhesive 48 also is applied as indicated to dispose another adhesive bond, but in these embodiments structural bond adhesive 48 is a thermoset adhesive or epoxy or an RTV adhesive, sources of which are known in the art. As with previously described embodiments, flex circuitry 30 then is folded so that upper major surfaces 18 of each CSP 12 are adjacent and brought into contact (similar to the depiction of FIG. 11) under an initial application of force sufficient to bond CSPs 12 with rapid bond adhesive 47, thus disposing respective adhesive bonds on CSP 12 not receiving the initial application of rapid bond adhesive 47 and a structural bond adhesive 48. While CSPs 12 are held in such configuration by rapid bond adhesive 47, structural bond adhesive 48 is allowed to set or cure and create another bond between CSPs 12. Depending on the structural bond adhesive 48 used, a rapid-cure system or ultraviolet light curing system alternatively may be employed to decrease the cure time. Such rapid-cure systems and ultraviolet light curing systems are known in the art.

Figure 13:
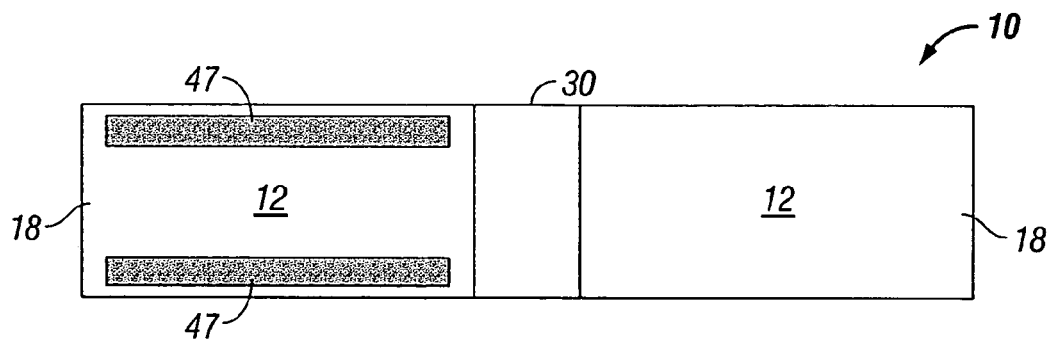
Figure 14A:
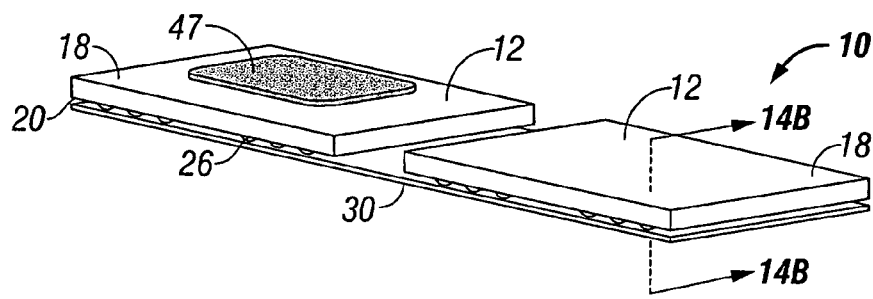
FIGS. 14A and 14B depict a step in a method for construction of a circuit module in accordance with a preferred embodiment of the present invention.
Figure 14B:
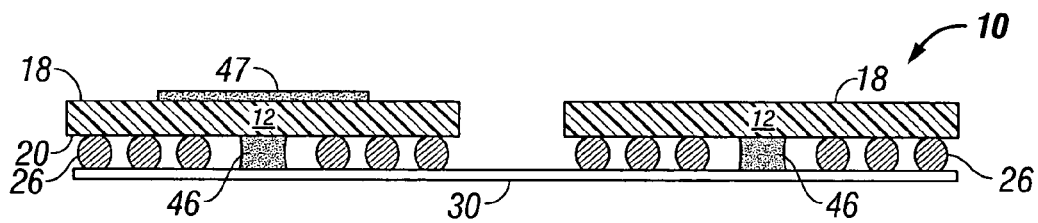
Figure 15:
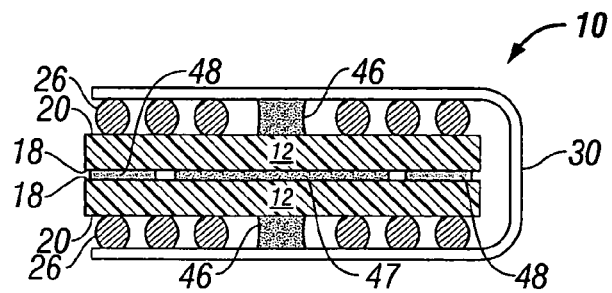
FIG. 15 depicts a circuit module in accordance with a preferred embodiment of the present invention.

FIGS. 13-15 depicts an additional preferred embodiments of the invention. In this embodiment, rapid bond adhesive 47 is applied to the upper major surface 18 of a CSP 12 as indicated in FIGS. 13 and 14. FIG. 14B depicts a cross section along line 14B-14B shown in FIG. 14A. Again, rapid bond adhesive 47 preferably is a pressure sensitive adhesive that quickly forms a bond and maintains the bond during successive solder reflow operations used to form high-temperature solder joints. As with previously described embodiments, flex circuitry 30 then is folded so that upper major surfaces 18 of each CSP 12 are adjacent and brought into contact (similar to the depiction of FIG. 11) under an initial application of force sufficient to bond CSPs 12 with rapid bond adhesive 47. After the bond of rapid bond adhesive 47 is established, structural bond adhesive 48 is injected into gaps between upper major surfaces 18 of CSP 12, resulting in the disposition of additional adhesive bonds on each of the CSPs. In this embodiment, structural bond adhesive 48 comprises a thermoset, snap-cure, or ultraviolet light curable adhesive known in the art.

Although the present invention has been described in detail, it will be apparent to those skilled in the art that the invention may be embodied in a variety of specific forms and that various changes, substitutions, alterations, and additions can be made without departing from the spirit and scope of the invention. The described embodiments are only illustrative and not restrictive, and therefore do not restrict or limit the scope of the invention, which is defined by the following claims.

The invention claimed is:

1. A circuit module comprising:
a first integrated circuit in stacked conjunction with
a second integrated circuit;
the first integrated circuit and the second integrated circuit being disposed in stacked alignment maintained by a first adhesive bond comprising rapid bond adhesive;
a second adhesive bond disposed on the first integrated circuit and the second integrated circuit comprising structural bond adhesive; and
a flex circuit having plural contact arrays, said flex being attached to the first integrated circuit with supplemental adhesive disposed between the plural contact arrays.

2. The circuit module of claim 1 in which the rapid bond adhesive comprises a pressure sensitive adhesive that bonds quickly and maintains the bond through repeated exposure to temperatures required to form high-temperature solder joints.

3. The circuit module of claim 1 in which the structural bond adhesive comprises thermoplastic bonding film with high shear and peel strength.

4. The circuit module of claim 1 in which the structural bond adhesive comprises a snap-cure or ultraviolet light curable adhesive.

5. The circuit module of claim 1 in which the structural bond adhesive comprises a thermoset adhesive or epoxy or an RTV adhesive.

6. A circuit module comprising:
a first integrated circuit of a first type in a stacked conjunction with two integrated circuits of a second type;
a first adhesive bond disposed on the first integrated circuit comprising rapid bond adhesive;
a second adhesive bond disposed on the two integrated circuits of second type; and
a flex circuit connecting the first integrated circuit of first type and the two integrated circuits of second type, said flex circuit having at least two contact arrays and said flex circuit being attached to said two integrated circuits of second type with supplemental adhesive disposed on the flex circuit between said at least two contact arrays.

* * * * *

UNITED STATES PATENT AND TRADEMARK OFFICE
CERTIFICATE OF CORRECTION

PATENT NO. : 7,656,678 B2
APPLICATION NO. : 11/263627
DATED : February 2, 2010
INVENTOR(S) : Julian Partridge et al.

It is certified that error appears in the above-identified patent and that said Letters Patent is hereby corrected as shown below:

On the Title Page (63), please delete "Continuation-in-part of application No. 10/958,584, filed on Oct. 5, 2004, which is a continuation of application No. 10/136,890, filed on May 2, 2002, now Pat. No. 6,940,729, application No. 11/263,627, which is a continuation-in-part of application No. 10/873,847, filed on Jun. 22, 2004, now Pat. No. 7,094,632, which is a continuation of application No. 10/631,886, filed on Jul. 11, 2003, now Pat. No. 7,026,708, which is a continuation-in-part of application No. 10/453,398, filed on Jun. 3, 2003, now Pat. No. 6,914,324, which is a continuation-in-part of application No. 10/005,581, filed on Oct. 26, 2001, now Pat. No. 6,576,992, said application No. 10/631,886 is a continuation-in-part of application No. 10/457,608, filed on Jun. 9, 2003, now abandoned, which is a continuation-in-part of application No. 10/005,581, filed on Oct. 26, 2001, now Pat. No. 6,576,992."

and insert --Continuation-in-part of application No. 10/958,584, filed on Oct. 5, 2004, now Pat. No. 7,606,048, which is a continuation of application No. 10/136,890, filed on May 2, 2002, now Pat. No. 6,940,729; application No. 11/263,627 is also a continuation-in-part of application No. 10/873,847, filed on Jun. 22, 2004, now Pat. No. 7,094,632, which is a continuation of application No. 10/631,886, filed on Jul. 11, 2003, now Pat. No. 7,026,708, which is a continuation-in-part of application No. 10/453,398, filed on Jun. 3, 2003, now Pat. No. 6,914,324, which is a continuation-in-part of application No. 10/005,581, filed on Oct. 26, 2001, now Pat. No. 6,576,992, said application No. 10/631,886 is a continuation-in-part of application No. 10/457,608, filed on Jun. 9, 2003, now abandoned, which is a continuation-in-part of application No. 10/005,581, filed on Oct. 26, 2001, now Pat. No. 6,576,992.--

Signed and Sealed this
Twenty-ninth Day of October, 2013

Teresa Stanek Rea
*Deputy Director of the United States Patent and Trademark Office*